(12) United States Patent
Kim et al.

(10) Patent No.: US 11,745,470 B2
(45) Date of Patent: Sep. 5, 2023

(54) POLYESTER FILM AND FLEXIBLE DISPLAY DEVICE COMPRISING THE SAME

(71) Applicant: SK microworks Co., Ltd., Gyeonggi-do (KR)

(72) Inventors: Gun Uk Kim, Gyeonggi-do (KR); Young Min Heo, Gyeonggi-do (KR); Sechul Lee, Gyeonggi-do (KR); Sang Min Choi, Gyeonggi-do (KR)

(73) Assignee: SK microworks Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/863,602

(22) Filed: Apr. 30, 2020

(65) Prior Publication Data

US 2020/0353734 A1 Nov. 12, 2020

(30) Foreign Application Priority Data

May 8, 2019 (KR) .................. 10-2019-0053677

(51) Int. Cl.
*B32B 17/10* (2006.01)
*B32B 27/36* (2006.01)
(Continued)

(52) U.S. Cl.
CPC .............. *B32B 17/10* (2013.01); *B32B 27/08* (2013.01); *B32B 27/281* (2013.01); *B32B 27/36* (2013.01);
(Continued)

(58) Field of Classification Search
CPC ......... B32B 17/10; B32B 27/36; B32B 27/08; B32B 27/281; B32B 2457/20; B32B 2307/412; B32B 2307/518; B32B 2307/704; B32B 2307/546; B32B 2250/03; B32B 3/04; B32B 2270/00; B32B 2307/54; B32B 2307/732; H05K 5/0017;
(Continued)

(56) References Cited

U.S. PATENT DOCUMENTS

| | | | | |
|---|---|---|---|---|
| 2004/0212885 | A1* | 10/2004 | Mizushima | G02F 1/133528 359/489.15 |
| 2009/0123767 | A1* | 5/2009 | Gohil | B32B 27/304 428/458 |
| 2009/0297860 | A1* | 12/2009 | Sasaki | B32B 27/302 428/423.7 |

FOREIGN PATENT DOCUMENTS

| JP | 2017-127980 A | 7/2017 |
|---|---|---|
| JP | 2017-536427 A | 12/2017 |

(Continued)

OTHER PUBLICATIONS

Heo Y, JP-2017227900-A Translation (Year: 2017).*

(Continued)

*Primary Examiner* — Nathan L Van Sell
(74) *Attorney, Agent, or Firm* — IP & T GROUP LLP (57) ABSTRACT

The polyester film according to the embodiment can maintain its original characteristics even after a plurality of repeated folding by adjusting the deformed dimension as compared with the initial dimension of the film, in particular, by adjusting the ratio between the deformed dimensions in two in-plane directions perpendicular to each other to a specific range, in the cycle of straining and relaxing the film. Accordingly, the polyester film can be applied to a cover of a flexible display device, in particular, a foldable display device to exhibit excellent characteristics.

7 Claims, 5 Drawing Sheets

(51) Int. Cl.
*H05K 5/00* (2006.01)
*H05K 5/03* (2006.01)
*B32B 27/08* (2006.01)
*B32B 27/28* (2006.01)
*C08J 5/18* (2006.01)
*C08G 63/06* (2006.01)

(52) U.S. Cl.
CPC .............. *C08G 63/065* (2013.01); *C08J 5/18* (2013.01); *H05K 5/0017* (2013.01); *H05K 5/03* (2013.01); *B32B 2307/412* (2013.01); *B32B 2457/20* (2013.01); *C08J 2367/03* (2013.01)

(58) Field of Classification Search
CPC . H05K 5/03; C08J 5/18; C08J 2367/03; C08J 2367/02; C08J 2367/00; C08G 63/065; G09F 9/301; B29C 55/12; G02F 1/133305
See application file for complete search history.

(56) References Cited

FOREIGN PATENT DOCUMENTS

| KR | 10-2017-0072885 A | 6/2017 | |
|---|---|---|---|
| KR | 10-2017-0109746 | 10/2017 | |
| KR | 20170110209 A * | 10/2017 | ......... H01L 51/5237 |
| WO | WO-2017142035 A1 * | 8/2017 | ............. B29C 55/08 |
| WO | 2018/159285 A | 9/2018 | |

OTHER PUBLICATIONS

Office Action issued the Japanese Patent Office dated Jun. 1, 2021.
Office Action issued by the Korean Patent Office dated Dec. 18, 2020.

* cited by examiner

POLYESTER FILM AND FLEXIBLE DISPLAY DEVICE COMPRISING THE SAME

TECHNICAL FIELD

Embodiments relate to a polyester film in which the straining cycle characteristics are controlled, a process for preparing the same, and an optical component comprising the same.

BACKGROUND ART

Display technologies continue to develop driven by the demand in tandem with the development of IT devices. Technologies on curved displays and bended displays have already been commercialized. In recent years, flexible display devices that can be flexibly bent or folded in response to an external force are preferred in the field of mobile devices that require large screens and portability at the same time. In particular, a foldable display device has the great advantages that it is folded to a small size to enhance its portability when not in use, and it is unfolded to form a large screen when used.

Figure 5A:
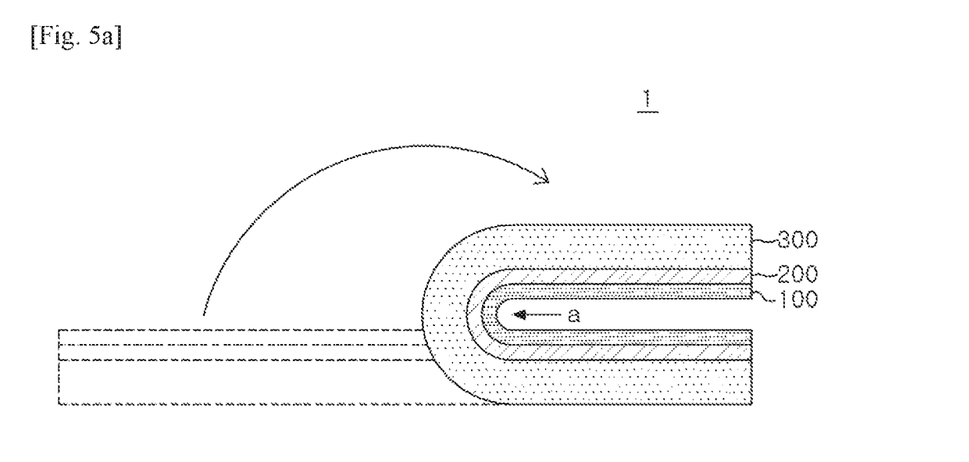
FIGS. 5a and 5b are cross-sectional views of an in-folding type and out-folding type flexible display devices, respectively.
Figure 5B:
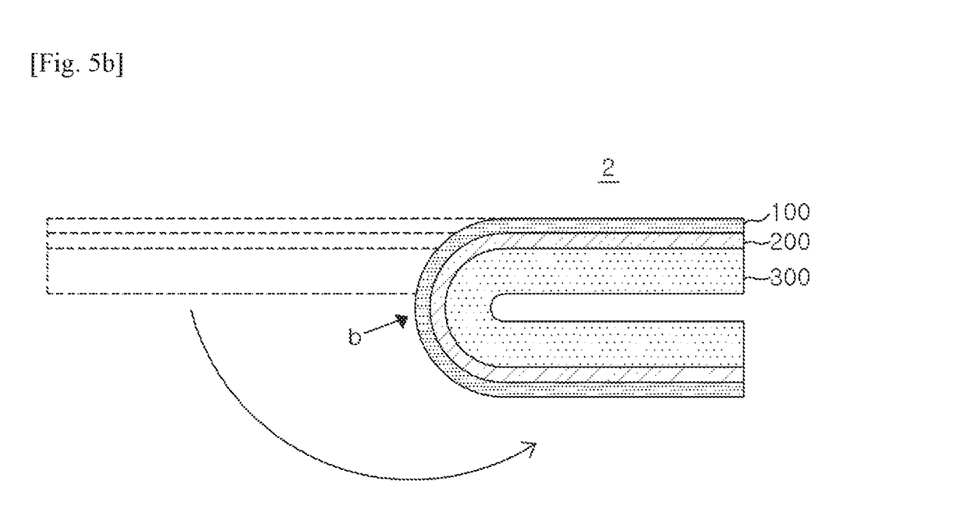

Referring to FIGS. 5a and 5b, such foldable display devices are being developed as an in-folding type (1) in which a screen is positioned inside the folding direction and an out-folding type (2) in which a screen is positioned outside the folding direction. As a transparent substrate (200) applied as a cover window of these foldable display devices, for example, a polyimide-based film is used in the in-folding type, and ultra-thin glass (UTG) is used in the out-folding type. In addition, a protective film (100) is applied to the surface of the transparent substrate (200) for shock absorption, scattering prevention, and scratch prevention. Recently, an attempt has been made to prepare a protective film for a flexible display device using a polyester resin (see Korean Laid-open Patent Publication No. 2017-0109746).

DISCLOSURE OF INVENTION

Technical Problem

In a material applied to flexible display devices, it is as important as flexibility that the original characteristics are not deteriorated despite frequent bending or folding. When a conventional material is completely folded and then unfolded, there remains a mark, and it is almost impossible to return to the original state. Thus, the development of materials applied to flexible display devices should be accompanied by research to overcome this limitation.

Specifically, whitening or cracks are generated in the protective film (100) or the like, which deteriorates the characteristics thereof, due to the deformation caused by compressive stress applied to the point (a) of small inward folding in the in-folding type (1) as shown in FIG. 5a and due to the deformation caused by tensile stress applied to the point (b) of large outward folding in the out-folding type (2) as shown in FIG. 5b. Such whitening and cracks can generally be solved when the modulus of the protective film is low at room temperature. Polyester resins, such as polyethylene terephthalate (PET), generally have a large modulus at room temperature, so that whitening and cracks are easily generated when applied to flexible display devices.

Thus, as a result of the research conducted by the present inventors, it has been discovered that, if the deformed dimension as compared with the initial dimension of a film is adjusted, in particular, if the ratio between the deformed dimensions in two in-plane directions perpendicular to each other is adjusted to a specific range, in the cycle of straining and relaxing the film, it is possible to make the film maintain its original characteristics even after a plurality of repeated folding.

Thus, an object of the embodiments is to provide a polyester film that achieves the characteristics required for a cover of a flexible display by adjusting the deformed dimension of a film in the cycle of straining and relaxing the film, and a process for preparing the same.

Another object of the embodiments is to provide a laminate of a transparent cover and a polyester film, which is capable of maintaining the original characteristics even after a plurality of repeated folding, and a flexible display device comprising the same.

Solution to Problem

According to one embodiment, there is provided a polyester film satisfying the following Relationship (1):

$$V2/V1 \leq 1.2 \tag{1}$$

In the above relationship, V1 and V2 are the deformed dimensions (mm) as compared with the initial dimensions upon 10 times of repetition of a procedure in which a film is strained by 2 mm as compared with the initial dimension in an in-plane first direction and in an in-plane second direction perpendicular to the first direction, respectively, and maintained for 10 seconds, and the film is then relaxed and maintained for 10 seconds.

According to another embodiment, there is provided a process for preparing a polyester film, which comprises molding a polyester resin to a sheet form and biaxially stretching it to obtain a polyester film satisfying the above Relationship (1).

In addition, there is provided a laminate, which comprises a transparent cover for a flexible display device; and a polyester film according to the embodiment disposed on the transparent cover.

In addition, there is provided a flexible display device, which comprises a polyester film according to the embodiment on a cover.

Advantageous Effects of Invention

The polyester film according to the embodiment can maintain its original characteristics even after a plurality of repeated folding when it is applied to a cover of a flexible displace device by adjusting the deformed dimension as compared with the initial dimension of the film, in particular, by adjusting the ratio between the deformed dimensions in two in-plane directions perpendicular to each other to a specific range, in the cycle of straining and relaxing the film.

Accordingly, the polyester film can be applied to a cover of a flexible display device, in particular, a foldable display device to exhibit excellent characteristics.

EXPLANATION OF REFERENCE NUMERALS

1: in-folding type flexible display device
2: out-folding type flexible display device
100: protective film
200: transparent cover
300: body of an in-folding type flexible display device
a, b: folding points
d: deformed dimension as compared with the initial dimension upon completion of the first cycle

BEST MODE FOR CARRYING OUT THE INVENTION

Throughout the description of the embodiments, in the case where each film, sheet, or layer is mentioned to be formed "on" or "under" another film, sheet, or layer, it means not only that one element is directly formed "on" or "under" another element, but also that one element is indirectly formed on or under another element with other element(s) interposed between them.

In addition, for the sake of description, the sizes of individual elements in the appended drawings may be exaggeratedly depicted and do not indicate the actual sizes.

In addition, all numbers expressing the physical properties, dimensions, and the like of components used herein are to be understood as being modified by the term "about" unless otherwise indicated.

Polyester Film

According to an embodiment, there is provided a polyester film satisfying the following Relationship (1):

$$V2/V1 \leq 1.2 \quad (1)$$

In the above relationship, V1 and V2 are the deformed dimensions (mm) as compared with the initial dimensions upon 10 times of repetition of a procedure in which a film is strained by 2 mm as compared with the initial dimension in an in-plane first direction and in an in-plane second direction perpendicular to the first direction, respectively, and maintained for 10 seconds, and the film is then relaxed and maintained for 10 seconds.

In each cycle, the dimensions of straining a film and the deformed dimensions after the cycle are all based on the initial dimensions when the cycle is not carried out.

Figure 1A:
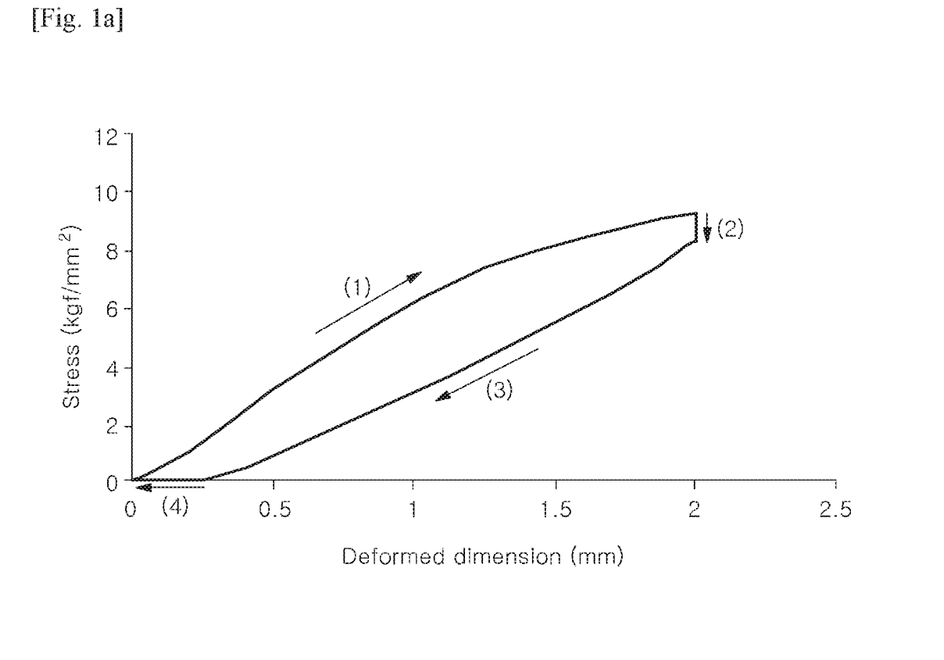
FIGS. 1a and 1b show the deformed dimensions as compared with the initial dimensions while a cycle of straining and relaxing a film is repeated.
Figure 1B:
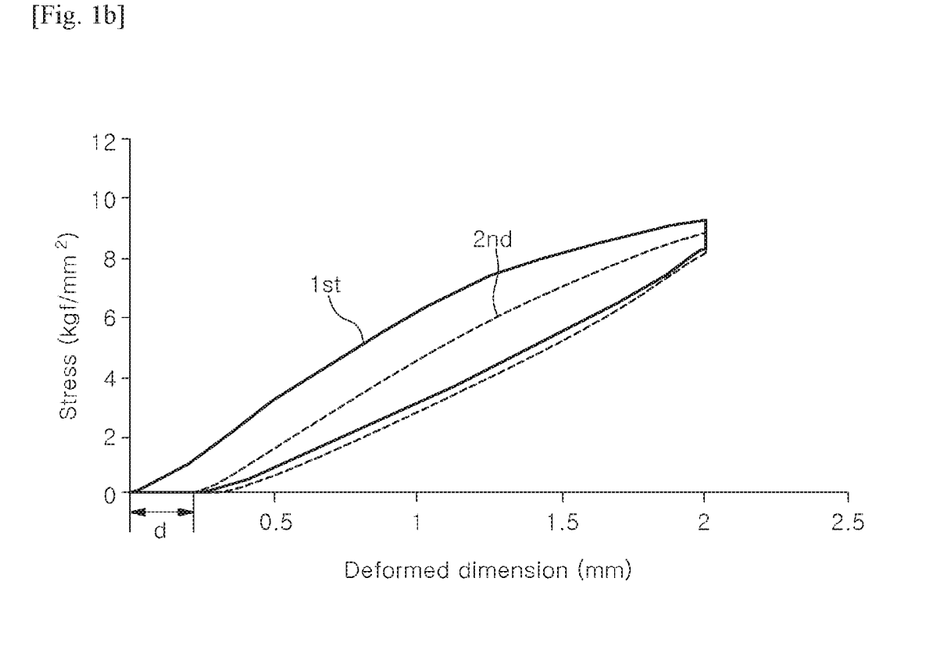

FIG. 1a shows a curve of stress with respect to a strained dimension in a cycle of straining and relaxing a film. FIG. 1b shows the deformed dimensions as compared with the initial dimensions when a cycle is repeated.

As shown in FIG. 1a, a tensile force is applied to a film to strain by 2 mm as compared with the initial dimension (1), and the film is maintained for 10 seconds without changing the applied tensile force (2). Thereafter, the tensile force applied to the film is removed to relax the film (3), and the film is maintained for 10 seconds while the tensile force is removed (4). The above procedure as one cycle is repeated 10 times.

As shown in FIG. 1b, the film upon the completion of the first cycle does not completely return to the initial dimension. Rather, it has a slightly increased dimension (d). Thus, the second cycle starts with the film slightly increased in dimension as compared with the initial dimension, and the film upon the completion of the second cycle has a slightly increased dimension as compared with that upon the completion of the first cycle. As the cycle repeats, the deformed dimension of the film upon the completion of each cycle increases as compared with the initial dimension.

The polyester film according to the embodiment can maintain its original characteristics even after a plurality of repeated folding when it is applied to a cover of a flexible displace device by adjusting the deformed dimension as compared with the initial dimension of the film, in particular, by adjusting the ratio between the deformed dimensions in two in-plane directions perpendicular to each other to a specific range, in the cycle of straining and relaxing the film.

V1 may be 1.0 mm or less, 0.7 mm or less, 0.6 mm or less, 0.5 mm or less, or 0.45 mm or less. For example, V1 may be 0.3 mm to 1.0 mm, 0.3 mm to 0.7 mm, or 0.4 mm to 0.6 mm.

V2 may be 1.0 mm or less, 0.8 mm or less, 0.7 mm or less, 0.6 mm or less, or 0.55 mm or less. For example, V2 may be 0.3 mm to 1.0 mm, 0.35 mm to 0.7 mm, or 0.45 mm to 0.6 mm.

In addition, the ratio of V2/V1 may be 1.2 or less, 1.15 or less, or 1.1 or less. As an example, the ratio of V2/V1 may be 0.8 to 1.2, 0.85 to 1.15, 0.9 to 1.1, 1 to 1.2, 1 to 1.15, or 1 to 1.1. As another example, the ratio of V2/V1 may be 1.05 to 1.2, 1.05 to 1.15, or 1.05 to 1.1.

As an example, V2 may be 0.7 mm or less, and the ratio of V2/V1 may be 1.1 or less. As another example, V2 may be 0.7 mm or less, and V1 may be 0.5 mm or less.

The first direction may be any direction in the plane of the polyester film, and the second direction may be determined in a direction in the plane perpendicular to the first direction.

Meanwhile, when the polyester film is stretched in the longitudinal direction (MD) and in the transverse direction (TD) in the preparation process, the tensile stress may be affected by these stretching directions.

Thus, the first direction may be the longitudinal direction (MD) or the transverse direction (TD) of the film, and the second direction may be the transverse direction (TD) or the longitudinal direction (MD) perpendicular thereto.

For example, the first direction may be the longitudinal direction (MD) of the film, and the second direction may be the transverse direction (TD) of the film.

Retardation of the Film

The polyester film may have an in-plane retardation (Ro) of 1,200 nm or less, 1,000 nm or less, 600 nm or less, 500 nm or less, 400 nm or less, 300 nm or less, or 200 nm or less. Within the above preferred range, it is possible to minimize the occurrence of rainbow stains.

Meanwhile, the lower limit of the in-plane retardation of the polyester film may be 0 nm. Alternatively, the lower limit of the in-plane retardation (Ro) may be 10 nm or more, 30 nm or more, or 50 nm or more in order to balance the optical characteristics and mechanical properties.

In addition, the polyester film may have a thickness direction retardation (Rth) of 5,000 nm or more or 6,000 nm or more. The thickness direction retardation may be a value measured based on a thickness of 40 μm to 50 μm. Within the above preferred range, the crystallization of the polyester film is minimized, which is preferable from the viewpoint of mechanical properties. In addition, as the thickness direction retardation (Rth) is larger, the ratio (Rth/Ro) of the thickness direction retardation (Rth) to the in-plane retardation (Ro) becomes larger, thereby effectively suppressing rainbow stains.

Meanwhile, the upper limit of the thickness direction retardation (Rth) may be 16,000 nm or less, 15,000 nm or less, or 14,000 nm or less, in view of the thickness limit and cost for eliminating rainbow stains in the polyester film.

Here, the in-plane retardation (Ro) is a parameter defined by a product ($\Delta nxy \times d$) of anisotropy ($\Delta nxy = |nx-ny|$) of refractive indices of two mutually perpendicular axes on a film and the film thickness (d), which is a measure of the degree of optical isotropy and anisotropy.

In addition, the thickness direction retardation is a parameter defined by a product of an average of the two birefringences $\Delta nxz$ ($=|nx-nz|$) and $\Delta nyz$ ($=|ny-nz|$) observed on a cross-section in the film thickness direction and the film thickness (d).

In addition, the polyester film may have a ratio (Rth/Ro) of the thickness direction retardation (Rth) to the in-plane retardation (Ro) of 10 or more, 15 or more, or 20 or more. The smaller the in-plane retardation (Ro) and the larger the thickness direction retardation (Rth), the more advantageous for preventing rainbow stains. Thus, it is preferable that the ratio (Rth/Ro) of the two values is maintained to be larger.

Film Composition

The polyester film comprises a polyester resin.

The polyester resin may be a homopolymer resin or a copolymer resin in which a dicarboxylic acid and a diol are polycondensed. In addition, the polyester resin may be a blend resin in which the homopolymer resins or the copolymer resins are mixed.

Examples of the dicarboxylic acid include terephthalic acid, isophthalic acid, orthophthalic acid, 2,5-naphthalene dicarboxylic acid, 2,6-naphthalene dicarboxylic acid, 1,4-naphthalene dicarboxylic acid, 1,5-naphthalene dicarboxylic acid, diphenylcarboxylic acid, diphenoxyethane dicarboxylic acid, diphenylsulfonic acid, anthracenedicarboxylic acid, 1,3-cyclopentanedicarboxylic acid, 1,3-cyclohexanedicarboxylic acid, 1,4-cyclohexanedicarboxylic acid, hexahydroterephthalic acid, hexahydroisophthalic acid, malonic acid, dimethyl malonic acid, succinic acid, 3,3-diethyl succinic acid, glutaric acid, 2,2-dimethylglutaric acid, adipic acid, 2-methyladipic acid, trimethyladipic acid, pimelic acid, azelaic acid, sebacic acid, suberic acid, dodecadicarboxylic acid, and the like.

In addition, examples of the diol include ethylene glycol, propylene glycol, hexamethylene glycol, neopentyl glycol, 1,2-cyclohexanedimethanol, 1,4-cyclohexanedimethanol, decamethylene glycol, 1,3-propanediol, 1,4-butanediol, 1,5-pentanediol, 1,6-hexanediol, 2,2-bis(4-hydroxyphenyl)propane, bis(4-hydroxyphenyl) sulfone, and the like.

Preferably, the polyester resin may be an aromatic polyester resin having excellent crystallinity. For example, it may have a polyethylene terephthalate (PET) resin as a main component.

As an example, the polyester film may comprise a polyester resin, specifically a PET resin, in an amount of at least about 85% by weight, more specifically at least 90% by weight, at least 95% by weight, or at least 99% by weight. As another example, the polyester film may further comprise a polyester resin other than the PET resin. Specifically, the polyester film may further comprise up to about 15% by weight of a polyethylene naphthalate (PEN) resin. More specifically, the polyester film may further comprise a PEN resin in an amount of about 0.1% by weight to 10% by weight or about 0.1% by weight to 5% by weight.

The polyester film having the above composition can have increased crystallinity and enhanced mechanical properties in terms of tensile strength and the like in the process of preparing the same through heating, stretching, and the like.

Characteristics and Use of the Film

The polyester film may have a thickness of 10 μm to 100 μm. Alternatively, the thickness of the polyester film may be 10 μm to 80 μm, 20 μm to 60 μm, or 40 μm to 60 μm.

The polyester film is preferably a stretched film due to its high crystallinity and excellent mechanical properties. For example, the polyester film may be biaxially stretched in an in-plane first direction and in an in-plane second direction perpendicular to the first direction. The stretching ratio in the first direction may be 2.0 to 5.0, specifically 2.8 to 3.5 or 3.3 to 3.5. In addition, the stretching ratio in the second direction may be 2.0 to 5.0, specifically 2.9 to 3.7 or 3.5 to 3.8. Specifically, the polyester film may be biaxially stretched at a stretching ratio of 3.3 to 3.5 in the longitudinal direction and at a stretching ratio of 3.5 to 3.8 in the transverse direction. In addition, the ratio (d2/d1) of the stretching ratio in the second direction (d2) to the stretching ratio in the first direction (d1) may be 1.2 or less. For example, it may be 1.0 to 1.2, 1.0 to 1.1, 1.0 to 1.15, or 1.05 to 1.1.

The polyester film may withstand 100 times or more, 1,000 times or more, 10,000 times or more, 50,000 times or more, 100,000 times or more, 150,000 times or more, or 200,000 times or more of repeated folding at an angle of 135° until it is broken. Specifically, the polyester film may withstand 100,000 times or more of repeated folding at an angle of 135° until it is broken. Within the above preferred range, it can be advantageously applied to a flexible display device since it is not broken even upon frequent folding.

The protective film can be applied to a cover of a flexible display device, in particular, a foldable display device, by virtue of these characteristics. It is possible to prevent deterioration in the original characteristics by the deformation occurring at the point of small inward folding in an in-folding type, as well as by the deformation occurring at the point of large outward folding in an out-folding type.

Process for Preparing a Polyester Film

The process for preparing a polyester film comprises molding a polyester resin to a sheet form and biaxially stretching it to obtain a polyester film satisfying the following Relationship (1):

$$V2/V1 \leq 1.2 \quad (1)$$

In the above relationship, V1 and V2 are the deformed dimensions (mm) as compared with the initial dimensions upon 10 times of repetition of a procedure in which a film is strained by 2 mm as compared with the initial dimension in an in-plane first direction and in an in-plane second direction perpendicular to the first direction, respectively, and maintained for 10 seconds, and the film is then relaxed and maintained for 10 seconds.

Here, the composition and process conditions are adjusted such that the polyester film finally produced by the above process satisfies Relationship (1). Specifically, in order for the final polyester film to satisfy the above Relationship (1), the extrusion and casting temperatures of the polyester resin are adjusted, the preheating temperature at the time of stretching, the stretching ratio in each direction, the stretching temperature, the stretching speed, and the like are adjusted, or heat setting and relaxation is carried out after stretching while the heat setting temperature and relaxation rate are adjusted.

Hereinafter, each step will be described in more detail.

A polyester resin is extruded to obtain an unstretched sheet.

In such event, the composition of the polyester resin used as a raw material of the optical film is as described above.

In addition, the extrusion may be carried out at a temperature of 230° C. to 300° C. or 250° C. to 280° C.

The film may be preheated at a certain temperature before stretching thereof. The preheating temperature satisfies the range of Tg+5° C. to Tg+50° C. based on the glass transition temperature (Tg) of the polyester resin, and it is determined to satisfy the range of 70° C. to 90° C. at the same time. Within the above range, the film may be soft enough to be readily stretched, and it is possible to effectively prevent the phenomenon of breakage during stretching thereof as well.

The stretching is carried out by biaxial stretching. For example, it may be biaxially stretched in the longitudinal direction (or machine direction; MD) and in the transverse direction (or tenter direction; TD) through a simultaneous biaxial stretching method or a sequential biaxial stretching method. Preferably, it may be carried out by a sequential biaxial stretching method in which stretching is first performed in one direction and then stretching is performed in the direction perpendicular thereto.

The stretching speed may be 6.5 m/min to 8.5 m/min, but it is not particularly limited thereto.

The stretching ratio in the longitudinal direction may be 2.0 to 5.0, specifically 2.8 to 3.5 or 3.3 to 3.5. In addition, the stretching ratio in the transverse direction may be 2.0 to 5.0, specifically 2.9 to 3.7 or 3.5 to 3.8. In addition, the ratio (d2/d1) of the stretching ratio in the transverse direction (d2) to the stretching ratio in the longitudinal direction (d1) may be 1.2 or less. For example, it may be 1.0 to 1.2, 1.0 to 1.1, 1.0 to 1.15, or 1.05 to 1.1. The stretch ratios (d1 and d2) refer to the ratios that represent the length after stretching as compared with the length before stretching being 1.0.

The process for preparing an optical film may further comprise heat setting the stretched film after the stretching.

The heat setting may be carried out at a temperature of 200° C. or less, specifically 180° C. to 190° C. The heat setting may be carried out for 5 seconds to 1 minute, more specifically for 10 seconds to 45 seconds.

In addition, the film may be relaxed in the longitudinal direction and/or in the transverse direction after the heat setting is initiated. In such event, the temperature may be in the range of 150° C. to 250° C. The relaxation may be carried out at a relaxation rate of 1% to 10%, 2% to 7%, or 3% to 5%. In addition, the relaxation may be carried out for 1 second to 1 minute, 2 seconds to 30 seconds, or 3 seconds to 10 seconds.

In addition, the film can be cooled after the heat setting. The cooling may be carried out under a temperature condition lower than the heat setting temperature by 50° C. to 150° C.

Laminate

The laminate according to one embodiment comprises a transparent cover for a flexible display device; and a polyester film according to the embodiment disposed on the transparent cover.

The polyester film in the laminate has substantially the same configuration and properties as those of the polyester film according to the embodiment as described above.

The transparent cover may be a cover window of a flexible display device.

The transparent cover may be a polymer film or a glass substrate. Specifically, the transparent cover may be a polyimide-based film or ultra-thin glass (UTG).

As an example, the transparent cover may comprise a polyimide resin.

The transparent cover may have a surface hardness of HB or higher and a light transmittance of 80% or higher at a wavelength of 550 nm. In addition, the transparent cover may have a yellowness of 5 or less and a haze of 2% or less based on a thickness of 50 μm.

The transparent cover may withstand 100 times or more, 1,000 times or more, 10,000 times or more, 50,000 times or more, 100,000 times or more, 150,000 times or more, or 200,000 times or more of repeated folding at an angle of 135° until it is broken. Within the above range, it can be advantageously applied to a flexible display device since it is not broken even upon frequent folding.

Specifically, the transparent cover may be a polyimide-based film, and the polyimide-based film may withstand 100,000 times or more of repeated folding at an angle of 135° until it is broken.

The laminate can be applied to a cover of a flexible display device, in particular a foldable display device, by virtue of these characteristics. It is possible to prevent deterioration in the characteristics by the deformation occurring at the point of small inward folding in an in-folding type, as well as by the deformation occurring at the point of large outward folding in an out-folding type.

Display Device

The flexible displace device according to one embodiment comprises a polyester film according to the embodiment on a cover.

Specifically, the flexible displace device comprises a flexible displace panel; and a polyester film according to the embodiment disposed on one side of the flexible displace panel.

Alternatively, the flexible displace device comprises a flexible displace panel; and a laminate (i.e., a laminate of a transparent cover and a polyester film) according to the embodiment disposed on one side of the flexible displace panel.

The flexible displace device may be a foldable display device.

Specifically, the foldable display device may be an in-folding type or an out-folding type depending on the folding direction.

The polyester film or the laminate in the flexible displace device has substantially the same configuration and properties as those of the polyester film or the laminate according to the embodiments as described above.

Specifically, the polyester film can achieve the characteristics required for a cover of a flexible display by adjusting the deformed dimension of a film in the cycle of straining and relaxing the film. As a result, it is possible that the polyester film and the laminate comprising the same maintain the original characteristics when they are applied to a cover of a flexible display device and subjected to a plurality of repeated folding.

Mode for the Invention

Hereinafter, the present invention will be described more specifically with reference to examples. But the scope of the present invention is not limited thereto only.

Examples 1 to 3 and Comparative Examples 1 to 4

A polyethylene terephthalate (PET) resin was extruded at about 250 to 280° C. in an extruder and cast to prepare an unstretched sheet. The unstretched sheet was preheated at about 70 to 90° C. and stretched about 3 to 3.5 times in the longitudinal direction (MD) and about 3.5 to 4 times in the transverse direction (TD). Thereafter, the stretched sheet was heat-set at about 185 to 240° C., relaxed at a relaxation rate of 3 to 5% for 3 to 10 seconds, and cooled. The preheating temperature at the time of stretching, the stretching ratio in each direction, the stretching temperature, the stretching speed, the heat setting temperature, and the relaxation rate were adjusted, so that polyester films having a thickness of 40 μm with various straining cycle characteristics as shown in Table 1 below were prepared.

The straining cycle characteristics shown in Table 1 below are the dimensions that have been deformed as compared with the initial dimensions upon repetition of the cycle in which a film was strained by 2 mm as compared with the initial dimension and maintained for 10 seconds, and the film was then relaxed and maintained for 10 seconds (see FIG. 1a) in the respective directions (MD and TD) (see FIG. 1b). Here, the dimensions are based on a film width of 15 mm, an initial dimension of 50 mm, a tensile speed of 10 mm/min, and a repetition of cycle 10 times.

TABLE 1

| | Deformed dimension (mm) upon 10 straining cycles in the respective directions | | Ratio of deformed dimensions |
|---|---|---|---|
| | MD | TD | TD/MD |
| Ex. 1 | 0.49 | 0.55 | 1.12 |
| Ex. 2 | 0.47 | 0.51 | 1.08 |
| Ex. 3 | 0.44 | 0.51 | 1.16 |
| C. Ex. 1 | 0.47 | 0.81 | 1.72 |
| C. Ex. 2 | 0.47 | 0.71 | 1.51 |
| C. Ex. 3 | 0.43 | 0.74 | 1.72 |
| C. Ex. 4 | 0.46 | 0.76 | 1.65 |

Figure 2A:
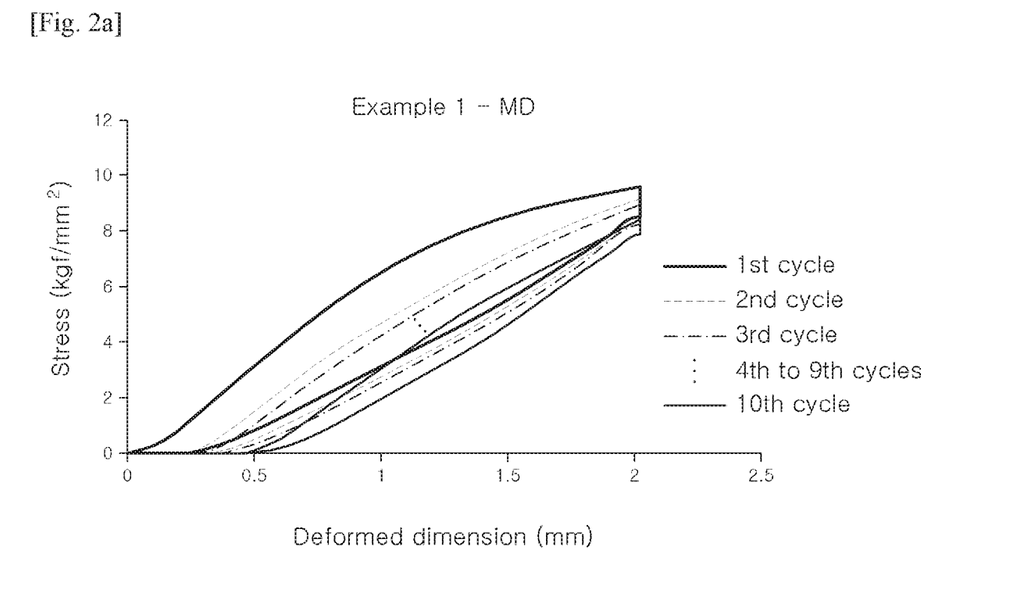
FIGS. 2a and 2b show the cycle characteristics of the film of Example 1 in the respective directions (MD and TD).
Figure 2B:
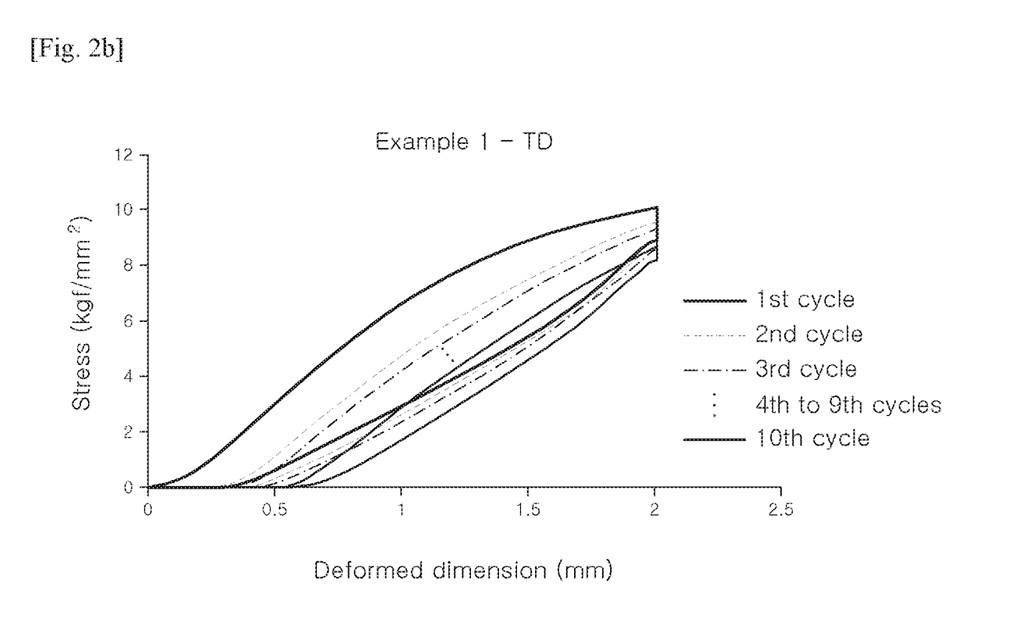
Figure 3A:
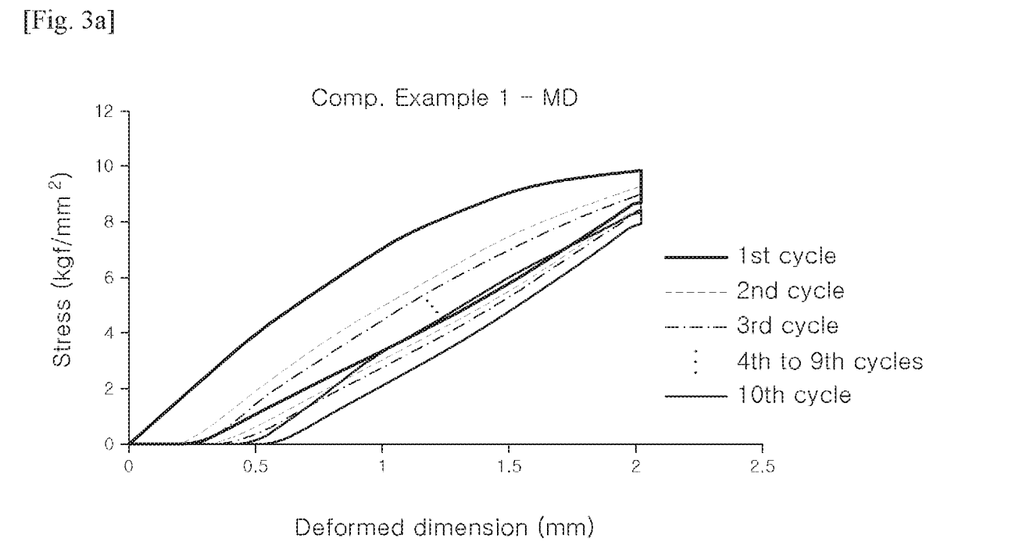
FIGS. 3a and 3b show the cycle characteristics of the film of Comparative Example 1 in the respective directions (MD and TD).
Figure 3B:
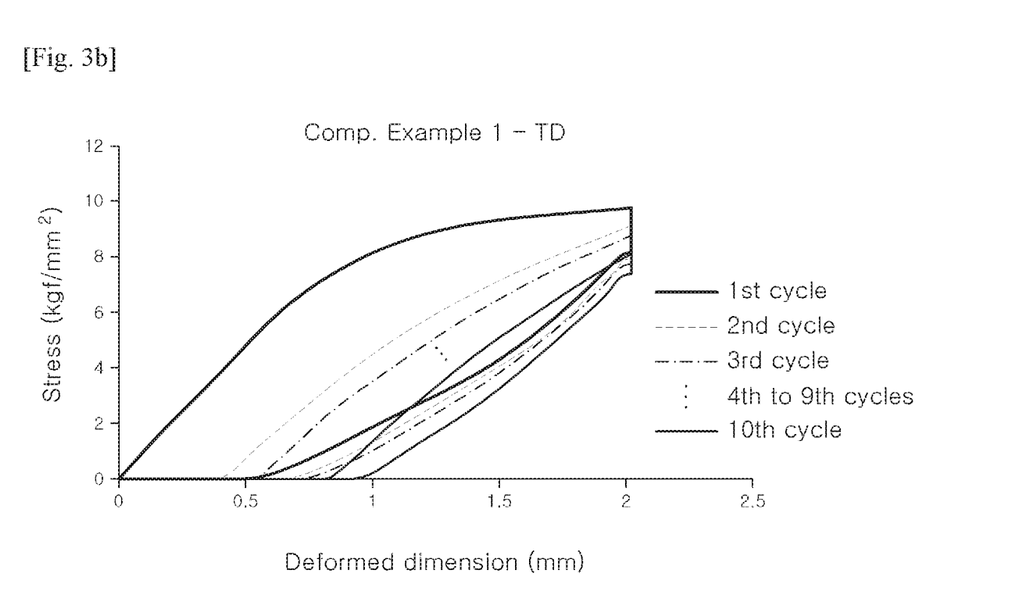
Figure 4A:
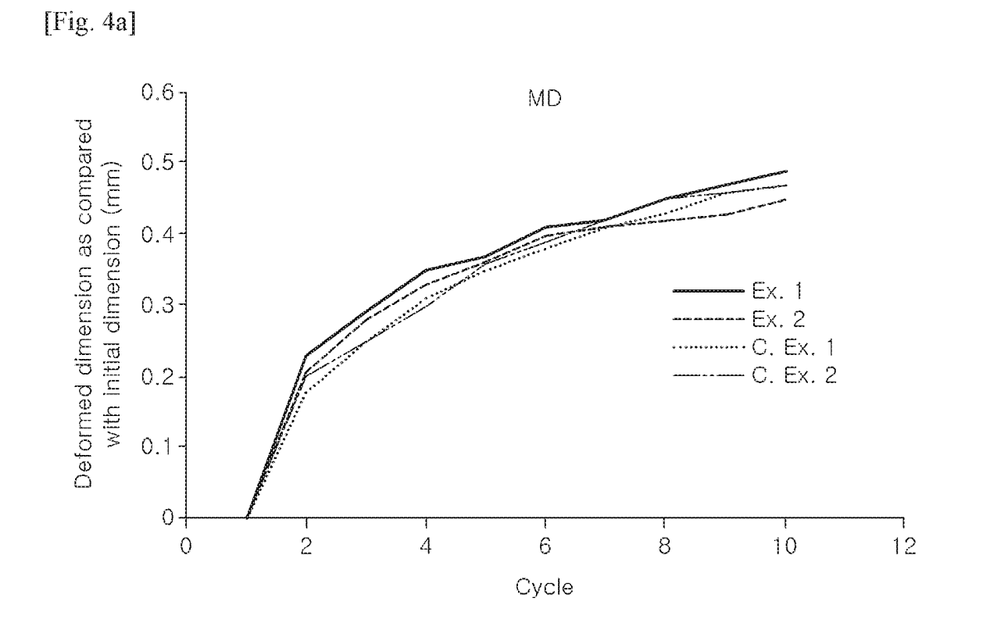
FIGS. 4a and 4b show the deformed dimensions as compared with the initial dimensions while a cycle of straining and relaxing a film is repeated in the respective directions (MD and TD).
Figure 4B:
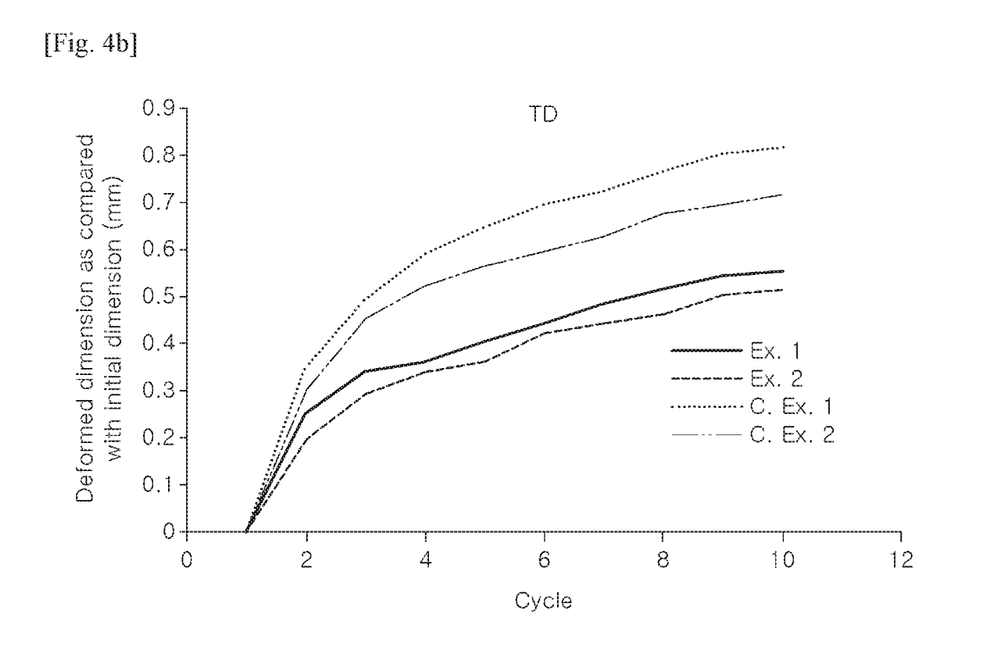

In addition, the cycle characteristics in the respective directions of the films of the Examples and Comparative Examples are shown in FIGS. 2a to 4b. FIGS. 2a and 2b show the cycle characteristics of the film of Example 1 in the respective directions (MD and TD). FIGS. 3a and 3b show the cycle characteristics of the film of Comparative Example 1 in the respective directions (MD and TD). FIGS. 4a and 4b show the deformed dimensions as compared with the initial dimensions in accordance with the number of repeated cycles in the respective directions (MD and TD).

As shown in the above tables and figures, the films of the Examples and Comparative Examples were prepared to have similar deformed dimensions in the MD but to have different deformed dimensions in the TD.

Specifically, the films of the Examples had a deformed dimension in the MD of 0.5 mm or less and a deformed dimension in the TD of 0.6 mm or less, whereas the films of the Comparative Examples had a deformed dimension in the MD of 0.5 mm or less and a deformed dimension in the TD of 0.7 mm or more.

Test Example 1: Evaluation of Folding

The prepared polyester film samples were subjected to the MIT folding test according to ASTM D 2176 and TAPPI T 511 using a folding endurance tester (MIT-DA, Toyoseiki). Specifically, the MIT folding test was carried out under the conditions of a folding angle of 135°, a sample size of 10 mm in width, a load of 500 gf, a radius of curvature of 0.38R, and a folding speed of 175 times/min. As a result, the number of folding repeated until cracks or breakage occurred was measured.

TABLE 2

| | Number of folding at 135° |
|---|---|
| Ex. 1 | 234,000 |
| Ex. 2 | 187,000 |
| Ex. 3 | 253,000 |
| C. Ex. 1 | 67,000 |
| C. Ex. 2 | 89,000 |
| C. Ex. 3 | 76,000 |
| C. Ex. 4 | 91,000 |

As shown in the above tables, the films of Examples 1 to 3 had a characteristic that the ratio between the deformed dimensions (TD/MD) upon 10 straining cycles in the respective directions was 1.2 or less. Thus, cracks or breakage did not occur even upon 100,000 times or more of repeated folding.

In contrast, the films of Comparative Examples 1 to 4 had a characteristic that the ratio between the deformed dimensions (TD/MD) upon 10 straining cycles in the respective directions exceeded 1.2. Thus, cracks or breakage occurred before 100,000 times of repeated folding.

The invention claimed is:

1. A polyester film, which withstands 200,000 times or more of repeated folding at an angle of 135° until it is broken and satisfies the following relationship (1):

$$V2/V1 \leq 1.2 \tag{1}$$

wherein V1 and V2 are the deformed dimensions (mm) as compared with the initial dimensions upon 10 times of repetition of a procedure in which a film is strained by 2 mm as compared with the initial dimension in an in-plane first direction and in an in-plane second direction perpendicular to the first direction, respectively, and maintained for 10 seconds, and the film is then relaxed and maintained for 10 seconds,
wherein the ratio of V2/V1 is 1.12 or more,
wherein the polyester film is biaxially stretched in the in-plane first direction and in the in-plane second direction,
wherein the stretching ratio in the in-plane direction is 3.3 to 3.5 and the stretching ratio in the in-plane second direction is 3.5 to 3.8,
wherein the ratio (d2/d1) of the stretching ratio in the in-plane second direction (d2) to the stretching ratio in the in-plane first direction (d1) is 1.05 to 1.1,
wherein the polyester film has a thickness direction retardation (Rth) of 5,000 nm to 16,000 nm,
wherein the polyester film has an in-plane retardation (Ro) of 1,200 nm or less, and
wherein the polyester film comprises a polyester resin, and the polyester resin is a polyethylene terephthalate (PET) resin, wherein V2 is 0.7 mm or less, and wherein the polyester film is applied to a cover of a flexible display device.

2. The polyester film of claim 1, wherein V1 is 0.5 mm or less.

3. The polyester film of claim 1, wherein the first direction is the longitudinal direction of the film, and the second direction is the transverse direction of the film.

4. A process for preparing a polyester film, which comprises molding a polyester resin to a sheet form and biaxially stretching it to obtain a polyester film,
wherein the polyester film withstands 200,000 times or more of repeated folding at an angle of 135° until it is broken and satisfies the following relationship (1):

$$V2/V1 \leq 1.2 \tag{1}$$

wherein V1 and V2 are the deformed dimensions (mm) as compared with the initial dimensions upon 10 times of repetition of a procedure in which a film is strained by 2 mm as compared with the initial dimension in an in-plane first direction and in an in-plane second direction perpendicular to the first direction, respectively, and maintained for 10 seconds, and the film is then relaxed and maintained for 10 seconds, wherein the ratio of V2/V1 is 1.12 or more, wherein the polyester film is biaxially stretched in the in-plane first direction and in the in-plane second direction, wherein the stretching ratio in the in-plane direction is 3.3 to 3.5 and the stretching ratio in the in-plane second direction is 3.5 to 3.8, wherein the ratio (d2/d1) of the stretching ratio in the in-plane second direction (d2) to the stretching ratio in the in-plane first direction (d1) is 1.05 to 1.1, wherein the polyester film has a thickness direction retardation (Rth) of 5,000 nm to 16,000 nm, wherein the polyester film has an in-plane retardation (Ro) of 1,200 nm or less, and wherein the polyester film comprises a polyester resin, and the polyester resin is a polyethylene terephthalate (PET) resin, wherein V2 is 0.7 mm or less, and wherein the polyester film is applied to a cover of a flexible display device.

5. A laminate, which comprises a transparent cover for a flexible display device; and the polyester film of claim 1 disposed on the transparent cover.

6. The laminate of claim 5, wherein the transparent cover is a polyimide-based film or ultra-thin glass (UTG).

7. A flexible display device, which comprises the polyester film of claim 1 on a cover.

* * * * *